(12) United States Patent
Nakamura (10) Patent No.: US 6,295,121 B1
(45) Date of Patent: *Sep. 25, 2001

(54) EXPOSURE APPARATUS

(75) Inventor: Gen Nakamura, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/774,883

(22) Filed: Dec. 27, 1996

(30) Foreign Application Priority Data

Jan. 5, 1996 (JP) .................................................... 8-017169

(51) Int. Cl.$^7$ .......................... G03B 27/54; G03B 27/42; G03B 27/52
(52) U.S. Cl. ................................. 355/67; 355/53; 355/30
(58) Field of Search .................................. 355/53, 67, 73, 355/75, 76, 30; 359/667, 512, 513; 362/263; 250/492.2, 492.22

(56) References Cited

U.S. PATENT DOCUMENTS

| 4,664,175 | * | 5/1987 | Yanagimoto et al. | 164/455 |
|---|---|---|---|---|
| 4,704,348 | * | 11/1987 | Koizumi et al. | 430/327 |
| 4,871,237 | | 10/1989 | Anzai et al. | 350/419 |
| 4,900,695 | * | 2/1990 | Takahashi et al. | 437/195 |
| 4,974,018 | * | 11/1990 | Komoriya et al. | 355/53 |
| 5,063,582 | * | 11/1991 | Mori et al. | 378/34 |
| 5,153,773 | | 10/1992 | Muraki et al. | 359/619 |
| 5,229,569 | * | 7/1993 | Miyauchi et al. | 219/121.6 |
| 5,310,624 | * | 5/1994 | Ehrlich | 430/322 |
| 5,363,170 | | 11/1994 | Muraki | 355/67 |
| 5,383,217 | * | 1/1995 | Uemura | 372/58 |
| 5,430,303 | * | 7/1995 | Matsumoto et al. | 250/492.2 |
| 5,559,584 | * | 9/1996 | Miyaji et al. | 355/73 |
| 5,696,623 | * | 12/1997 | Fujie et al. | 359/350 |

FOREIGN PATENT DOCUMENTS

| 2-210813 | 8/1990 | (JP) . |
|---|---|---|
| 6-260385 | 9/1994 | (JP) . |
| 6-260386 | 9/1994 | (JP) . |

* cited by examiner

Primary Examiner—Russell Adams
Assistant Examiner—Hung Henry Nguyen
(74) Attorney, Agent, or Firm—Fitzpatrick, Cella, Harper & Scinto (57) ABSTRACT

An exposure apparatus includes a light supplying device for supplying exposure light, an optical system for directing the exposure light to a substrate to be exposed, a cover for covering a predetermined portion of the optical system, a gas supply device for supplying an inert gas to the inside of the cover, a detector for detecting a quantity of the inert gas inside the cover and a controller for controlling the light supplying device on the basis of an output of the detector.

66 Claims, 5 Drawing Sheets

EXPOSURE APPARATUS

FIELD OF THE INVENTION AND RELATED ART

This invention relates to an exposure apparatus and, more particularly, to a projection exposure apparatus using an excimer laser, for example, and being suitable for the manufacture of various devices such as semiconductor devices, for example.

In order to meet the miniaturization of microdevices such as semiconductor devices (ICs, LSIs) or liquid crystal panels, those light sources (exposure light sources) which provide light of a shorter wavelength have been used in exposure apparatuses. More specifically, in exposure apparatuses for semiconductor device manufacture, for example, g-line light of a super high pressure Hg lamp has been replaced by i-line light, for reduced wavelength. Currently, the wavelength of KrF excimer laser light (248 nm) or ArF excimer laser light (193 nm), which is deep ultraviolet light of a shorter wavelength, is used.

Since light of a KrF excimer laser or an ArF excimer laser in the deep ultraviolet region has a high photon energy, there is a possibility that, due to the action of the energy, minute dust along the path of the light reacts with oxygen in air along the path, with a result of adhesion of impurities to the optical system (lens surface or mirror surface), or that the lens coating material of the optical system reacts with oxygen in the air, with a result of contamination of the optical system. In order to avoid adhesion of impurities to the optical system or contamination of the optical system, conventionally, an inert or inactive gas is charged to flow along the path of deep ultraviolet light to thereby prevent reaction of dust or the lens coating material with oxygen. To this end, a serviceman or operator is required to do the following work in relation to the portion of the optical system which is filled with an inert gas: that is, in order to avoid suffocation with the inert gas, first, the serviceman or operator closes the main tap of the inert gas, which is usually located at the back of the exposure apparatus, and then checks stoppage of the flow of inert gas into the portion of the apparatus, filled with the inert gas. After an elapse of a certain time period, the serviceman or operator opens the cover of the portion filled with the inert gas.

When the apparatus is to be re-started after completion of the above-described work, the serviceman or operator closes the cover of the portion to be filled with inert gas, and opens the main tap of the inert gas at the back of the apparatus. The serviceman or operator has to wait there for an elapse of a certain time period, until the portion to be filled with inert gas is filled with the inert gas.

This procedure needs many and time-consuming steps: to close the main tap of the inert gas at the back of the apparatus; to check stoppage of flow of inert gas into the portion filled with inert gas; to leave the apparatus for a certain time period; and to open the cover of the portion filled with inert gas. If the operator makes an error and opens the cover of the portion filled with inert gas, without shutting off the main tap, for example, there is a danger to the life of the operator since the operator may be exposed to the inert gas. Even if the main tap is closed, if the cover is opened before the density of inert gas is decreased sufficiently, the operator may similarly be exposed to the inert gas, which is very dangerous to the life of the operator.

Also, in relation to a re-start of the apparatus after completion of the above-described work, the procedure needs many and time-consuming steps: thereafter, to close the cover of the portion to be filled with inert gas; to open the main tap of inert gas at the back of the apparatus; and thereafter, to leave the apparatus for a certain time period until that portion is filled with the inert gas. If the operator makes an error to miss opening the main tap after closing the cover of the portion to be filled with inert gas, there is a possibility that the excimer laser is oscillated before inert gas charging. Laser emission in the state in which the inert gas charging is not started or completed causes adhesion of impurities to the optical system or contamination of the lens coating material of the optical system, as described hereinbefore, and it results in decreased optical performance. If such impurity adhesion of or contamination occurs, the optical element (or elements) damaged has to be demounted from the optical system. Thus, an enormous volume of work is necessary to recover adequate optical performance of the optical system. This directly decreases the operation efficiency of the apparatus.

SUMMARY OF THE INVENTION

It is an object of the present invention to provide an improved exposure apparatus which assures a smaller decrease in optical performance and enables enhanced safety.

In accordance with an aspect of the present invention, there is provided an exposure apparatus, comprising: an optical system for directing exposure light to a substrate to be exposed; a cover for a predetermined portion of said optical system; gas supplying means for supplying an inert or inactive gas to the inside of said cover; detecting means for detecting a quantity of inert gas inside said cover; and notifying means for notifying information related to the quantity of inert gas, on the basis of an output of said detecting means.

Said detecting means may detect a density of the inert gas.

Said detecting means may detect a flow rate of the inert gas.

Said cover may have one of a door and a lid, and said apparatus may further comprise fixing means for fixing said door to said cover as said door or said lid is being closed.

Said apparatus may further comprise a sensor for detecting closure/opening of said door or said lid.

Said apparatus may further comprise an excimer laser for providing the exposure light.

Said notifying means may include display means for displaying the information.

Said optical system may include an illumination optical system for illuminating a mask, and the predetermined portion to be covered by said cover may be a portion of or the whole of said illumination optical system.

Said optical system may further include a projection optical system for projecting a pattern of the mask, illuminated by said illumination optical system, onto the substrate to be exposed.

Said apparatus may further comprise an excimer laser for providing the exposure light.

Said detecting means may detect a density of the inert gas.

Said detecting means may detect a flow rate of the inert gas.

Said cover may have one of a door and a lid, and said apparatus may further comprise fixing means for fixing said door to said cover as said door or said lid is being closed.

Said notifying means may include first display means for displaying the information.

Said cover may have one of a door and a lid, and said apparatus may further comprise a sensor for detecting closure/opening of said door or said lid.

Said supplying means may include an electromagnetically openable/closable valve for adjusting flow of the inert gas.

Said electromagnetically openable/closable valve may be controlled on the basis of an output of said sensor.

Said notifying means may further include second display means for displaying closure/opening of said electromagnetically openable/closable valve.

Said apparatus may further comprise control means wherein, when an output of said sensor represents a change of said door or said lid from a closed state to an open state, said control means is serviceable to close said electromagnetically openable/closable valve, is serviceable to cause said second display means to display closure of said electromagnetically openable/closable valve, and is serviceable to cause said first display means to display whether a detected value, detected by said detecting means, exceeds a predetermined value.

When an output of said sensor represents a change of said door or said lid from the closed state to the open state, said control means may be serviceable to produce a signal to stop light emission of said excimer laser.

Said apparatus may further comprise control means wherein, when an output of said sensor represents a change of said door or said lid from an open state to a closed state, said control means is serviceable to open said electromagnetically openable/closable valve, is serviceable to cause said second display means to display opening of said electromagnetically openable/closable valve, and is serviceable to cause said first display means to display whether a detected value, detected by said detecting means, exceeds a predetermined value.

When an output of said sensor represents that the detected value, detected by said detecting means, does not exceed the predetermined value, said control means may be serviceable to continue stoppage of light emission of said excimer laser, and wherein, when an output of said sensor represents that the detected value exceeds the predetermined value, said control means may allow light emission of said excimer laser.

Said apparatus may further comprise third display means for displaying a state of light emission of said excimer laser.

Said apparatus may comprise different covers for different portions of said illumination optical system, and said gas supplying means may supply inert gases to insides of said covers, respectively.

In accordance with another aspect of the present invention, there is provided an exposure apparatus, comprising: light supplying means for supplying exposure light; an optical system for directing the exposure light to a substrate to be exposed; a cover for a predetermined portion of said optical system: gas supplying means for supplying an inert gas to the inside of said cover; detecting means for detecting a quantity of inert gas inside said cover; and discriminating means for discriminating whether a detected value, detected by said detecting means, exceeds a predetermined value, wherein, when said discriminating means discriminates an excess of the detected value beyond the predetermined value, said discriminating means produces a signal for allowing supply of exposure light by said light supplying means.

Said supplying means may include an excimer laser.

In accordance with a further aspect of the present invention, there is provided a device manufacturing method including a step of transferring a device pattern onto a photosensitive layer of a substrate by use of an exposure apparatus as recited, and a step of developing the substrate after the device pattern transfer step.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
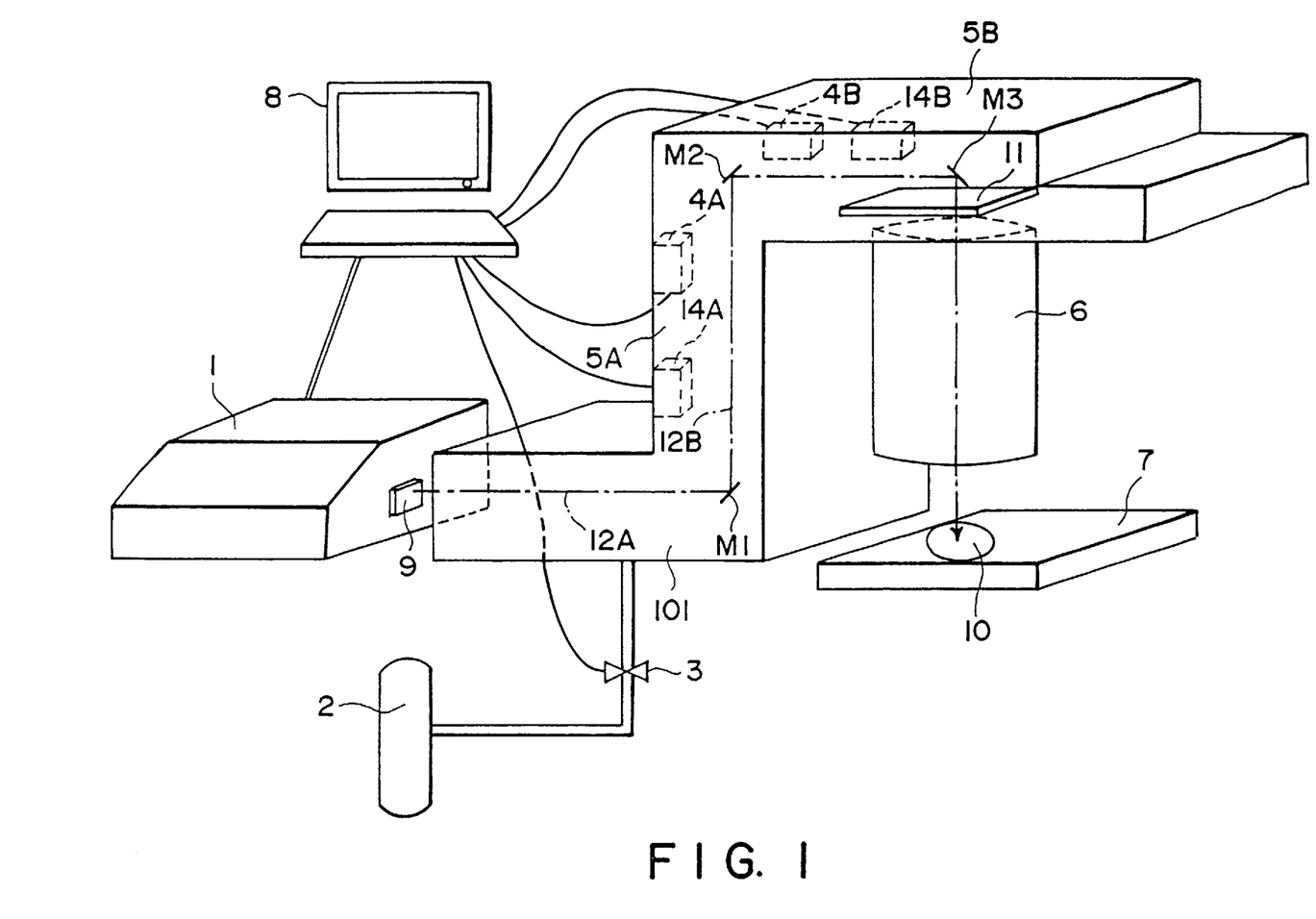
FIG. 1 is a perspective view of an illumination system of an exposure apparatus according to a first embodiment of the present invention.
Figure 2:
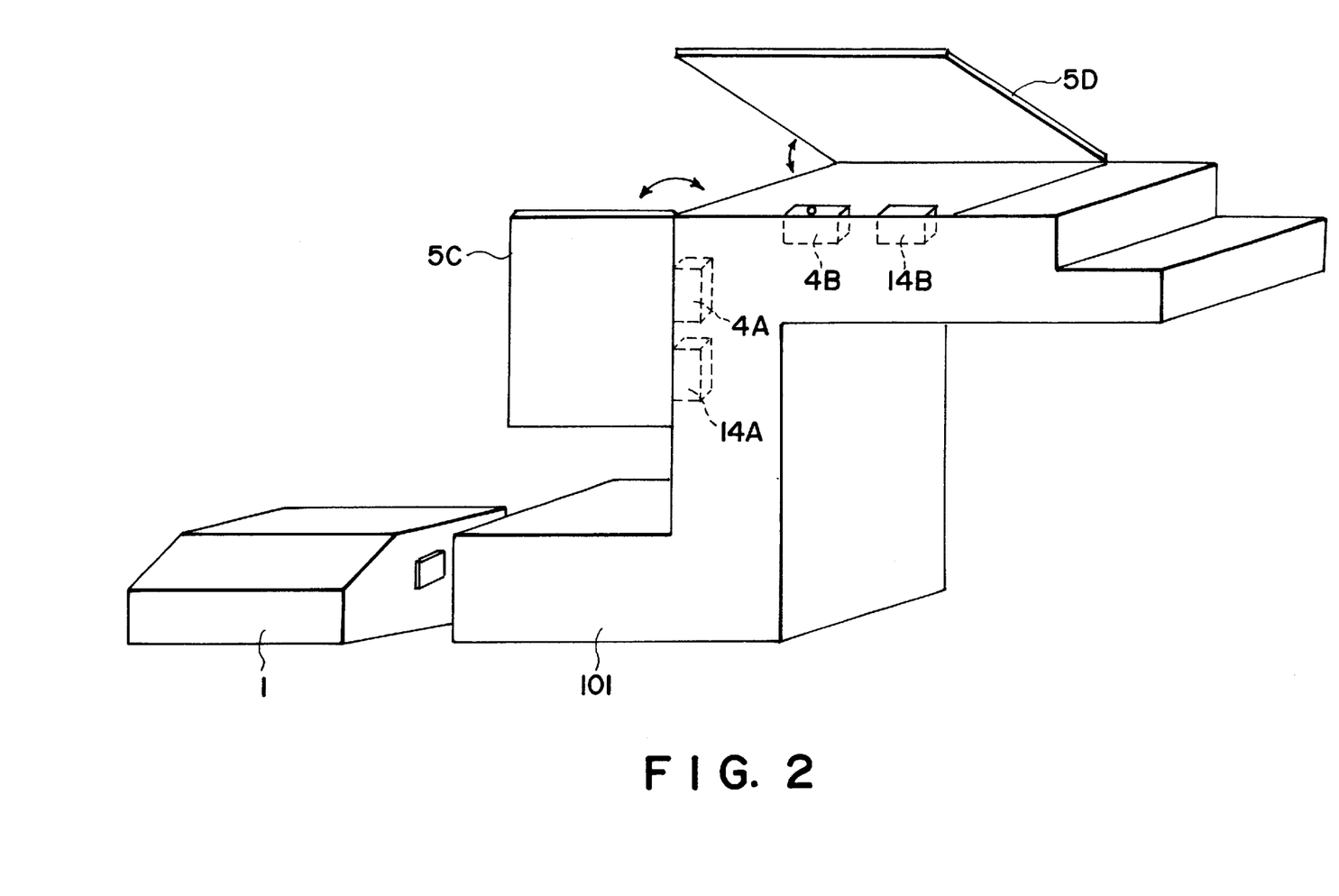
FIG. 2 illustrates a cover member of the first embodiment as it is opened.

FIGS. 1 and 2 of the drawings illustrate the structure of a semiconductor device manufacturing exposure apparatus according to a first embodiment of the present invention. The exposure apparatus includes a light source which comprises a KrF excimer laser (laser head) 1. Laser light 12 is emitted from an emission port 9 of the excimer laser 1 into a housing 101. The laser light 12 goes along a light path 12A and 12B inside a laser light directing illumination optical system 5, and it is projected onto a reticle 11. The optical system 5 comprises a vertical portion 5A and a horizontal portion 5B. The optical system 5 includes mirrors M1, M2 and M3 illustrated as well as lenses, a fly's eye lens, a rotatable prism, and a beam splitter, for example. These elements may have a structure as disclosed in U.S. Pat. Nos. 5,153,773 or 5,363,170, for example.

The reticle 11 has a device pattern such as a semiconductor circuit device pattern, for example, which is formed thereon. Projection lens 6 serves to project and image the pattern of the reticle onto a wafer 10 in a reduced scale, by which the pattern is printed on the wafer. The wafer 10 is placed on an X-Y stage 7 which is movable in X and Y directions. Through simultaneous whole-surface exposure or scan exposure followed by stepwise motion, circuit device patterns are printed on different zones of the wafer.

The vertical portion 5A and the horizontal portion 5B of the optical system 5 are provided with separate covers (barrels). Each cover is provided with a door or lid mounted thereon, for maintenance or any other operation. When the door (lid) 5C of the vertical portion 5A is opened, a door opening/closing detecting sensor 4A provided in the vertical portion 5A detects that the door 5C is opened. When the door (lid) 5D of the horizontal portion 5B is opened, another door opening/closing detecting sensor 4B detects that the door 5D is opened. About the door opening/closing sensors 4A and 4B inside the covers of the vertical and horizontal portions 5A and 5B, there are gas density sensors 14A and 14B for detecting the degree of inert gas charging. Inert gas flows into the vertical and horizontal portions 5A and 5B, through inlet ports formed in the covers of the portions 5A and 5B, respectively. Also, the gas flows out of the vertical and horizontal portions 5A and 5B, through outlet ports formed in the covers of them, respectively.

In FIG. 1, there is an inert gas supply tank 2 for inert gas charging, which is communicated with the optical system 5 through piping. The piping is provided with an electromagnetically openable/closable valve 3 for controlling discharge of inert gas. In this embodiment, nitrogen ($N_2$) gas is contained in the tank 2. The door opening/closing detecting sensors 4A and 4B, the inert gas sensors 14A and 14B, the electromagnetically openable/closable valve 3 and the excimer laser 1 described above are all connected to a controller 8. The controller 8 serves to control the valve 3 and light emission of the excimer laser 1, on the basis of output signals from the door opening/closing detecting sensors 4A and 4B and the gas density sensors 14A and 14B.

Next, the operation of the apparatus controlled by the controller 8, will be explained. FIG. 2 illustrates the state in which the door of the optical system 5 is being opened by a serviceman or operator, for maintenance of the optical system 5. Here, a case for maintenance of the vertical portion will be described.

Figure 3:
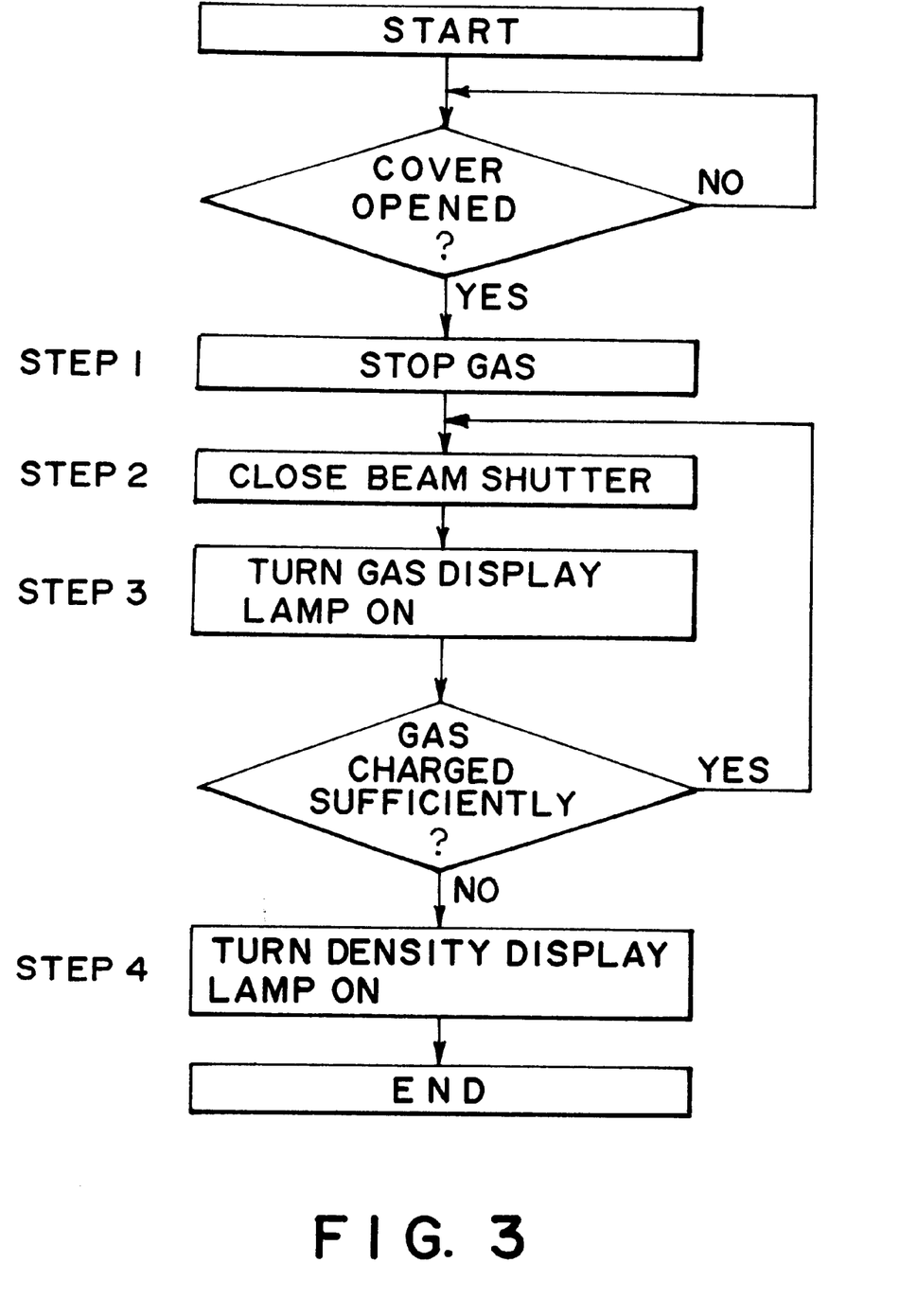
FIG. 3 is a flow chart for illustrating a procedure of stoppage and supply of inert gas, in accordance with the present invention.

For maintenance of the vertical portion 5A of the optical system, first the light emission of the excimer laser 1 is stopped. Then, the relevant door 5C is opened. The door opening/closure detecting sensor 4A detects that the door 5C is in the open state, and it produces an electrical signal that represents the open state and applies the same to the controller 8. The procedure is illustrated in the flow of FIG. 3, and checking opening/closure corresponds to step 1 of FIG. 3.

On the basis of the signal from the sensor 4A, the controller 8 discriminates that the door 5C has changed from its closed state to the open state. The controller 8 then operates to close the electromagnetically openable/closable valve 3 mounted on the piping of the inert gas. Also, it applies a laser light emission stopping signal to the excimer laser 1 to shut the beam. If the laser is provided with a beam shutter, the beam shutter may be closed. This operation corresponds to step 2 of the flow chart of FIG. 3. Table 1 below lists four states of the apparatus based on the outputs of the door opening/closure detecting sensor and of the inert gas density sensor. The change in state of the apparatus described just above corresponds to a transition from State 1 to State 2 in Table 1.

TABLE 1

| | DOOR SENSOR | GAS DENSITY SENSOR | GAS CHARGE | LASER EMISSION |
|---|---|---|---|---|
| STATE 1 | CLOSED | ABOVE THRES. | ON | EMITTABLE |
| STATE 2 | OPEN | ABOVE THRES. | OFF | UNEMITTABLE |
| STATE 3 | OPEN | BELOW THRES. | OFF | UNEMITTABLE |
| STATE 4 | CLOSED | BELOW THRES. | ON | UNEMITTABLE |

In accordance with the above-described sequential operation, the controller 8 causes a monitor thereof to display the information that the supply of inert gas, having been discharged into the vertical portion 5A of the optical system 5, is stopped. This corresponds to step 3 of the flow of FIG. 3.

Subsequently, the controller 8 operates to check the degree of inert gas charge within the vertical portion 5A, by using the inert gas density sensor 14A. If the sensor 14A detects that the degree of inert gas charge has decreased to a predetermined level or lower, the controller 8 causes its monitor to display that the degree of inert gas charge (density) in the vertical portion has reached a safe level. This operation corresponds to step 4 of the flow chart of FIG. 3, and it means that the state of the apparatus has changed from State 2 to State 3 in Table 1.

As the safeness is confirmed through the above-described procedure and by means of the controller 8, the operator or serviceman can start the maintenance operation for the vertical portion 5A of the optical system, safely.

A similar procedure applies to performing maintenance for the horizontal portion 5B of the optical system 5. That is, for the maintenance of the inside components of the horizontal portion 5B of the optical system 5, first the light emission of the excimer laser is stopped. Then, the door 5D of the horizontal portion 5B of the housing is opened. The door opening/closure detecting sensor 4B detects that the door 5D has changed into an open state, and it produces an electrical signal, representing the open state, and applies the same to the controller 8. This corresponds to step 1.

On the basis of the output signal from the sensor 4B, the controller 8 discriminates that the door 5D has changed from its closed state to the open state. The controller 8 then operates to close the electromagnetically openable/closable valve 3, mounted on the piping of the inert gas, and also it supplies a laser light emission stopping signal to the excimer laser 1 to stop the beam. If the excimer laser 1 is provided with a beam shutter, the beam shutter may be closed. This operation corresponds to step 2. If the opening operation for the door 5C of the vertical portion 5A is being performed in parallel and if the closing operation of the electromagnetic valve 3 and supply of a light emission stopping signal to the excimer laser head 1 are already done, a further supply of an emission stopping signal from the controller 8 may of course be omitted.

In accordance with the sequential operations described above, the controller 8 caused its monitor to display that the supply of inert gas, having been discharged into the horizontal portion 5B of the optical system 5, is stopped (step 3).

The controller 8 continues measurement of the degree of inert gas charge within the horizontal portion 5B through the inert gas density sensor 14B. If the sensor 14B detects that the degree of inert gas charge has decreased to a predetermined level or lower, the controller 8 causes its monitor to display that the degree of inert gas charge (density) in the horizontal portion 5B has reached a safe level. When the safeness is confirmed through the above-described procedure and by means of the controller 8, the operator or serviceman can start the maintenance operation for the optical system 5 safely.

Next, a description will be made of how the apparatus should be restarted after a completion of maintenance by a serviceman or an operator. As the maintenance operation by the serviceman or operator is finished, the serviceman or operator closes the door of the portion of the optical system 5 to which the maintenance operation has been done (e.g., door 5C is closed if the maintenance operation has been done to the vertical portion 5A). As the door 5C of the vertical portion 5A is closed, for example, the sensor 4A detects that the door 5C is closed, and it applies an electrical signal, representing the closed state, to the controller 8. In response to reception of the signal from the sensor 4A, the controller 8 discriminates the door closure. Also, the controller 8 checks the state of the other door sensor or sensors of the other portion of the optical system.

If all the other sensors are in the closed state, the controller 8 operates to open the electromagnetic valve 3 of the inert gas piping. This operation corresponds to step 5 of the flow chart of FIG. 4, and it means a transition of the state of the apparatus from State 3 to State 4 in Table 1.

Under this situation, the controller 8 causes its monitor to display that inert gas charging to the charging path (light path) has started. This corresponds to step 6 of FIG. 4. Simultaneously therewith, the controller 8 checks the result of measurement through the inert gas density sensor 14A, mounted on the vertical portion 5A of the optical system 5 to which the operation has been done. The sensor 14A continuously measures the inert gas density along the path of charging, and if the degree of gas charge (density) in that portion is not greater than a predetermined level, it means that the degree of inert gas charge to the optical path is insufficient. Thus, the sensor 14A applies a corresponding electrical signal to the controller 8. As the measurement continues and when the degree of inert gas charge reaches a predetermined level or higher, the gas density sensor 14A discriminates that the inert gas density has become sufficient and it applies a corresponding electrical signal to the controller 8. The controller 8 also monitors output signals from other inert gas density sensors mounted in the other portion or portions of the optical system, and it concludes a total inert gas charging state of the apparatus as a whole. If at least one of those inert gas density sensors indicates a low degree of inert gas charge, lower than the predetermined level, stoppage of laser light emission of the excimer laser 1 is held.

If all the inert gas density sensors disposed along the inert gas charge path show that the degree of inert gas charge in the portions of the gas charge path has reached a predetermined level or higher, the controller 8 applies a laser light emission allowance to the excimer laser 1. This operation corresponds to step 7 of FIG. 4, and the apparatus changes from State 4 to State 1 of Table 1.

Simultaneously therewith, the controller 8 causes its monitor to display that the inert gas charge level has become high and thus, emission of the excimer laser is enabled. This operation correspond to step 8 of FIG. 4.

Figure 4:
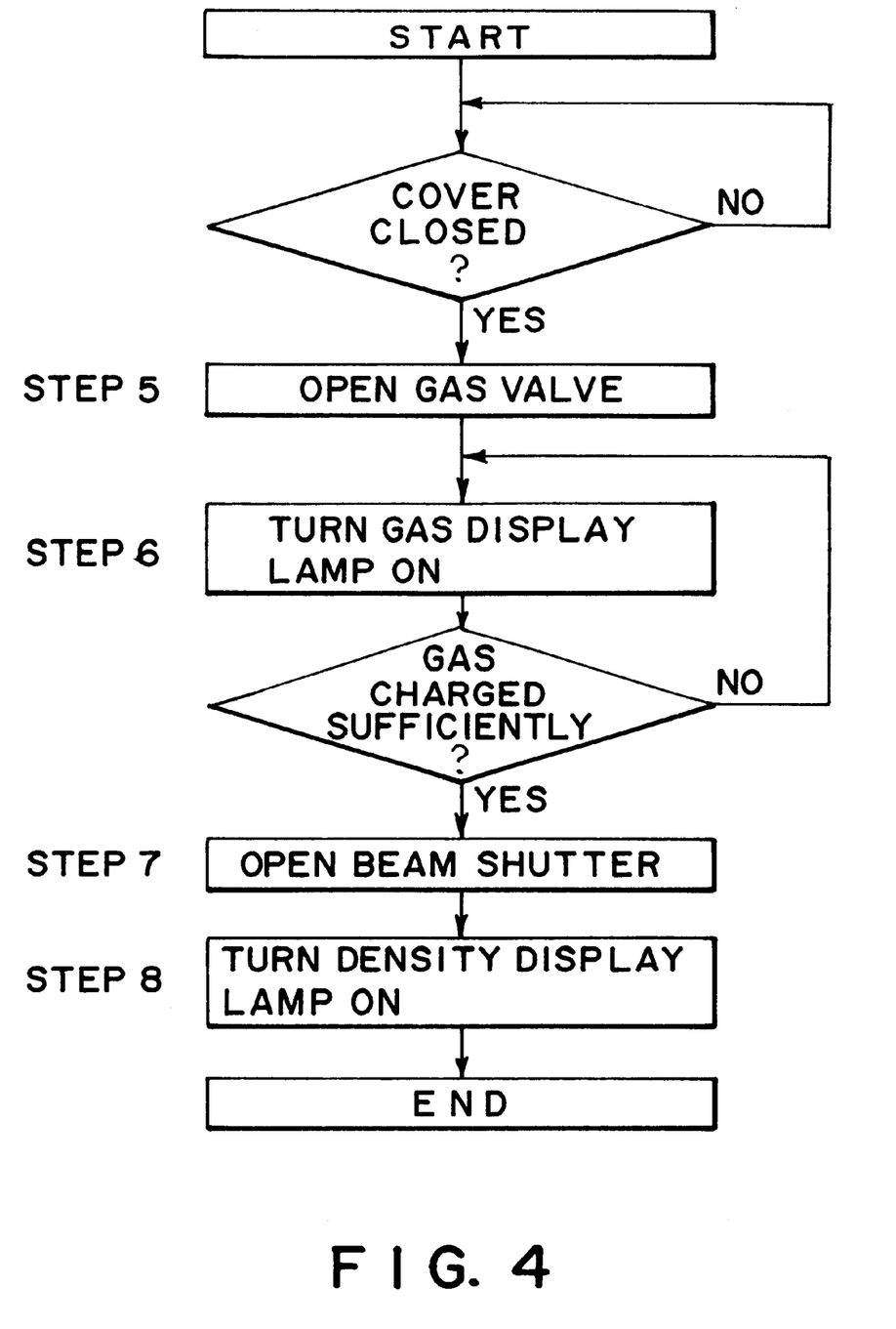
FIG. 4 is a flow chart for illustrating another example of a procedure of stoppage and supply of inert gas, in accordance with the present invention.

Through the operations described above, the inert gas charge level has been confirmed and the apparatus has recovered to its operation mode. A start of operation after the recover may be done automatically or it may be done manually with an input by the serviceman or operator.

Figure 5:
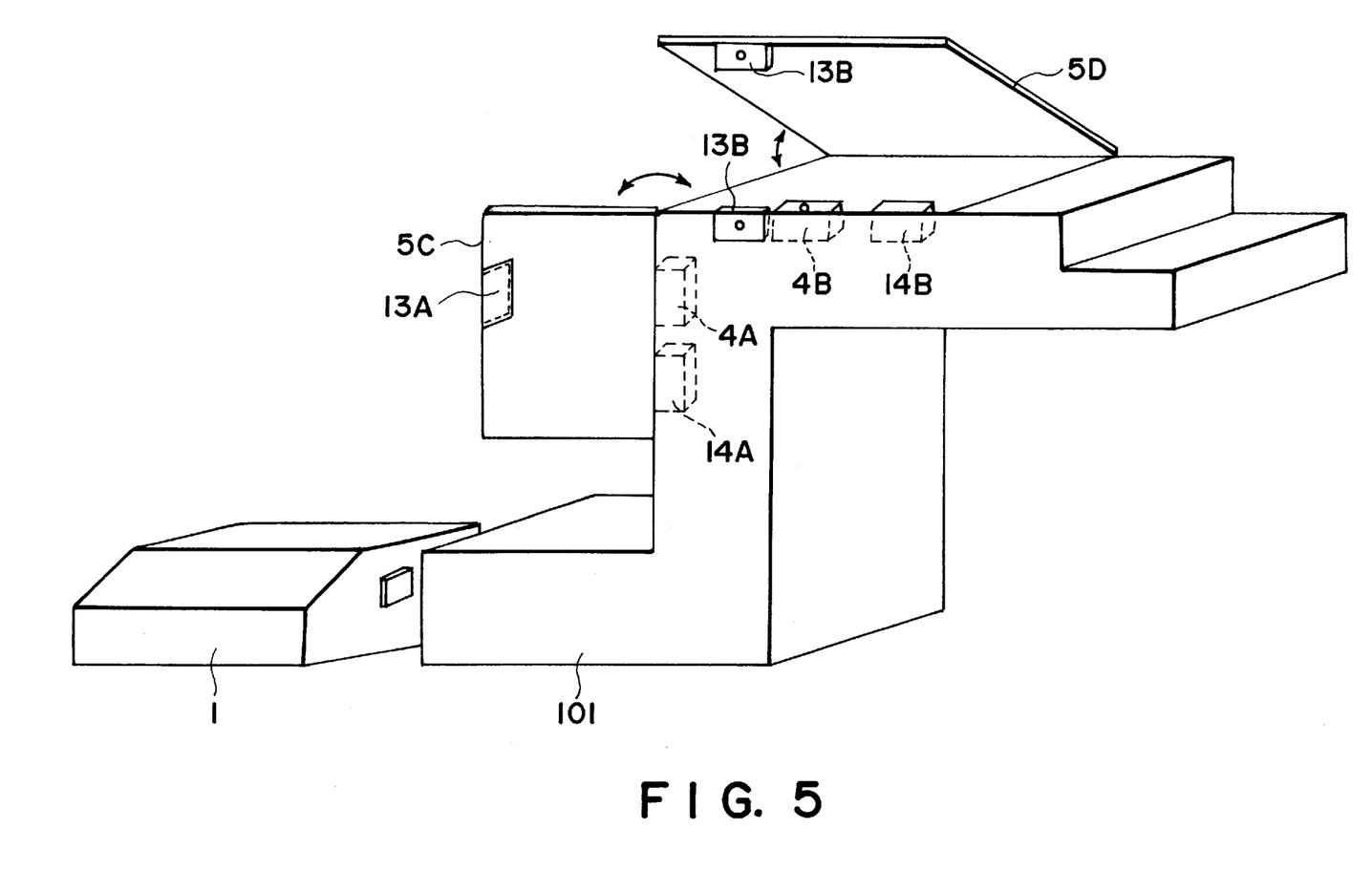
FIG. 5 is a perspective view of an exposure apparatus according to a second embodiment of the present invention.

FIG. 5 illustrates a main portion of a second embodiment of the present invention. This embodiment differs from the first embodiment in that there are fixing mechanisms 13A and 13B mounted to fix the doors 5C and 5D of the optical system 5. These fixing mechanisms 13A and 13B are connected to the controller 8, and they operate to control fixation/release of the doors 5C and 5D in response to a signal from the controller 8.

When maintenance for the vertical portion 5A of the optical system 5 is to be done by an operator or serviceman, first, a maintenance start command is inputted from a keyboard of the controller 8. As the command is inputted, the controller 8 applies a laser light emission stopping signal to the excimer laser 1. Simultaneously therewith, the controller 8 operates to close the electromagnetic valve 3 mounted on the inert gas piping.

After the sequential operations described, the controller 8 causes its monitor to display that the supply of inert gas, having been discharged into the vertical portion 5A of the optical system 5, is stopped. Further, the controller 8 checks the degree of inert gas charge in the charge path 5A, through the gas density sensor 14A. As the inert gas charge level becomes lower than a predetermined value, the controller 8 causes its monitor to display that the inert gas charge level (density) has reached a safe level. Simultaneously therewith, it applies a door opening signal to the fixing mechanism 13A.

As the fixing mechanism 13A releases the door 5C in response to the door opening signal, the controller 8 causes its monitor to display that the door 5C is rendered into an openable state. On the basis of this display, the operator or serviceman may open the door 5C to start the maintenance operation.

Similar operations in relation to the vertical portion 5A apply to the maintenance operation for the horizontal portion 5B of the optical system 5. That is, first, a maintenance start command is inputted from the keyboard of the controller 8. As the command is inputted, the controller 8 applies a laser light emission stopping signal to the excimer laser 1. Simultaneously therewith, the controller 8 operates to close the electromagnetic valve 3 mounted on the inert gas piping.

After the sequential operations described, the controller 8 causes its monitor to display that the supply of inert gas, having been discharged into the vertical portion 5A of the optical system 5, is stopped. Further, the controller 8 checks the degree of inert gas charge in the charge path 5B, through the gas density sensor 14B. As the inert gas charge level becomes lower than a predetermined value, the controller 8 causes its monitor to display that the inert gas charge level (density) has reached a safe level. Simultaneously therewith, it applies a door opening signal to the fixing mechanism 13B.

As the fixing mechanism 13B releases the door 5D in response to the door opening signal, the controller 8 causes its monitor to display that the door 5D is rendered into an openable state. On the basis of this display, the operator or serviceman may open the door 5D to start the maintenance operation.

The procedure for restoring the apparatus after the maintenance by the operator or serviceman is completed, is essentially the same as that of the first embodiment.

Although in the first and second embodiments, the inert gas density is measured by using gas density sensor means, the sensor means may be replaced by an inert gas flow meter for measuring the flow rate.

While the invention has been described with reference to examples of semiconductor device manufacturing exposure apparatus, the invention is similarly applicable to other types of semiconductor device manufacturing apparatuses using inert gas.

In accordance with the embodiments as described above, there is provided a system such as an exposure apparatus which uses an excimer laser and which needs filling with an inert gas, wherein sensor means for detecting an inert gas charge level is disposed in the portion filled with or to be filled with the inert gas, and wherein the system is controlled on the basis of an output of the sensor means. This avoids the risk of suffocation of an operator or serviceman by the inert gas or exposure to the inert gas, due to an error by the operator or serviceman. Thus, danger to the life of the operator or serviceman is reduced.

Further, the sufficiency of the degree of inert gas charge is detected automatically and a light emission signal is outputted to an excimer laser. This prevents emission of light in the state in which the inert gas is not charged for an error of the operator or serviceman. Thus, adhesion of impurities to the optical system or contamination of lenses of the optical system is avoided. This effectively reduces the volume and time of the maintenance operation of the apparatus, and it increases the operation efficiency of the apparatus and enhances the lifetime of the apparatus.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus comprising:
   light supplying means for supplying light;
   an optical system for directing the light to a substrate to be exposed;
   a cover for covering a predetermined portion of said optical system;
   gas supplying means for supplying an inert gas to the inside of said cover;
   detecting means for detecting a quantity of the inert gas inside said cover;
   control means for controlling said light supplying means on the basis of an output of said detecting means; and
   notifying means for notifying an operator of information related to the quantity of inert gas on a basis of an output of said detecting means.

2. An apparatus according to claim 1, wherein said cover has one of a door and a lid, and wherein said apparatus further comprises fixing means for fixing said door to said cover as said door or said lid is being closed.

3. An apparatus according to claim 2, further comprising a sensor for detecting closure/opening of said door or said lid.

4. An apparatus according to claim 1, wherein said notifying means includes display means for displaying the information.

5. An apparatus according to claim 1, wherein said optical system includes an illumination optical system for illuminating a mask, and wherein the predetermined portion to be covered by said cover is a portion of or the whole of said illumination optical system.

6. An apparatus according to claim 5, wherein said optical system further includes a projection optical system for projecting a pattern of the mask, illuminated by said illumination optical system, onto the substrate to be exposed.

7. An apparatus according to claim 6, further comprising an excimer laser for providing the exposure light.

8. An apparatus according to claim 7, wherein said detecting means detects a density of the inert gas.

9. An apparatus according to claim 7, wherein said detecting means detects a flow rate of the inert gas.

10. An apparatus according to claim 7, wherein said cover has one of a door and a lid, and wherein said apparatus further comprises fixing means for fixing said door to said cover as said door or said lid is being closed.

11. An apparatus according to claim 7, wherein said notifying means includes first display means for displaying the information.

12. An apparatus according to claim 11, wherein said cover has one of a door and a lid, and wherein said apparatus further comprises a sensor for detecting closure/opening of said door or said lid.

13. An apparatus according to claim 12, wherein said supplying means includes an electromagnetically openable/closable valve for adjusting a flow of the inert gas.

14. An apparatus according to claim 13, wherein said electromagnetically openable/closable valve is controlled on the basis of an output of said sensor.

15. An apparatus according to claim 13, wherein said notifying means further includes second display means for displaying closure/opening of said electromagnetically openable/closable valve.

16. An apparatus according to claim 15, further comprising control means wherein, when an output of said sensor represents a change of said door or said lid from a closed state to an open state, said control means closes said electromagnetically openable/closable valve, causes said second display means to display closure of said electromagnetically openable/closable valve, and causes said first display means to display whether a detected value, detected by said detecting means, exceeds a predetermined value.

17. An apparatus according to claim 16, wherein, when an output of said sensor represents a change of said door or said lid from the closed state to the open state, said control means produces to a signal to stop light emission of said excimer laser.

18. An apparatus according to claim 15, further comprising control means wherein, when an output of said sensor represents a change of said door or said lid from an open state to a closed state, said control means closes said electromagnetically openable/closable valve, causes said second display means to display opening of said electromagnetically openable/closable valve, and causes said first display means to display whether a detected value, detected by said detecting means, exceeds a predetermined value.

19. An apparatus according to claim 18, wherein, when an output of said sensor represents that the detected value, detected by said detecting means, does not exceed the predetermined value, said control means continues stoppage of light emission of said excimer laser, and wherein, when an output of said sensor represents that the detected value exceeds the predetermined value, said control means allows light emission of said excimer laser.

20. An apparatus according to claim 7, further comprising third display means for displaying a state of light emission of said excimer laser.

21. An apparatus according to claim 7, wherein said apparatus comprises a plurality of covers for respectively covering a plurality of different portions of said illumination optical system, and wherein said gas supplying means supplies inert gases to insides of said covers, respectively.

22. An apparatus according to claim 1, wherein said detecting means detects one of a flow rate and a density of the inert gas.

23. An apparatus according to claim 1, wherein said light supplying means comprises an excimer laser for providing laser light.

24. An exposure apparatus, comprising:
    light supplying means for supplying exposure light;
    an optical system for directing the exposure light to a substrate to be exposed;
    a cover for covering a predetermined portion of said optical system;
    gas supplying means for supplying an inert gas to the inside of said cover;
    detecting means for detecting a quantity of inert gas inside said cover; and
    discriminating means for discriminating whether a detected value, detected by said detecting means, exceeds a predetermined value, wherein, when said discriminating means discriminates an excess of the detected value beyond the predetermined value, said discriminating means produces a signal for allowing supply of the exposure light by said light supplying means.

25. An apparatus according to claim 24, wherein said light supplying means includes an excimer laser.

26. An exposure apparatus, comprising:

light supplying means for supplying light;

an optical system for directing the light to a substrate to be exposed, wherein said optical system includes an illumination optical system for illuminating a mask and a projection optical system for projecting a pattern of the mask, illuminated by said illumination optical system, onto the substrate to be exposed;

a cover for covering a predetermined portion of said optical system, wherein the predetermined portion to be covered by said cover is a portion of or the whole of said illumination optical system;

gas supplying means for supplying an inert gas to the inside of said cover;

detecting means for detecting a quantity of the inert gas inside said cover;

control means for controlling said light supplying means on the basis of an output of said detecting means; and notifying means for notifying information related to the quantity of inert gas, wherein said notifying means comprises display means for displaying the information.

27. An apparatus according to claim 26, wherein said light supplying means comprises an excimer laser for providing the light.

28. An apparatus according to claim 26, wherein said notifying means comprises means for notifying an operator of information related to the quantity of inert gas on a basis of an output of said detecting means.

29. An apparatus according to claim 28, wherein said cover has one of a door and a lid, and said apparatus further comprises fixing means for fixing said door to said cover as said door or said lid is being closed.

30. An apparatus according to claim 29, further comprising a sensor for detecting closure/opening of said door or said lid.

31. An apparatus according to claim 26, wherein said detecting means detects a density of the inert gas.

32. An apparatus according to claim 26, wherein said detecting means detects a flow rate of the inert gas.

33. An apparatus according to claim 26, wherein said cover has one of a door and a lid, and said apparatus further comprises fixing means for fixing said door to said cover as said door or said lid is being closed.

34. An apparatus according to claim 26, further comprising display means for displaying a state of light emission of said excimer laser.

35. An apparatus according to claim 26, wherein said apparatus comprises a plurality of covers for respectively covering a plurality of different portions of said illumination optical system, and said gas supplying means supplies inert gases to insides of said covers, respectively.

36. An apparatus according to claim 26, wherein said cover has one of a door and a lid, and said apparatus further comprises a sensor for detecting closure/opening of said door or said lid.

37. An apparatus according to claim 36, wherein said supplying means includes an electromagnetically openable/closable valve for adjusting a flow of the inert gas.

38. An apparatus according to claim 37, wherein said electromagnetically openable/closable valve is controlled on the basis of an output of said sensor.

39. An apparatus according to claim 37, wherein said notifying means further includes second display means for displaying closure/opening of said electromagnetically openable/closable valve.

40. An apparatus according to claim 39, further comprising control means wherein, when an output of said sensor represents a change of said door or said lid from a closed state to an open state, said control means closes said electromagnetically openable/closable valve, causes said second display means to display closure of said electromagnetically openable/closable valve, and causes said first display means to display whether a detected value, detected by said detecting means, exceeds a predetermined value.

41. An apparatus according to claim 40, wherein, when an output of said sensor represents a change of said door or said lid from the closed state to the open state, said control means produces a signal to stop light emission of said light supplying means.

42. An apparatus according to claim 39, further comprising control means wherein, when an output of said sensor represents a change of said door or said lid from an open state to a closed state, said control means opens said electromagnetically openable/closable valve, causes said second display means to display opening of said electromagnetically openable/closable valve, and causes said first display means to display whether a detected value, detected by said detecting means, exceeds a predetermined value.

43. An apparatus according to claim 42, wherein, when an output of said sensor represents that the detected value, detected by said detecting means, does not exceed the predetermined value, said control means continues stoppage of light emission of said light supplying means, and wherein, when an output of said sensor represents that the detected value exceeds the predetermined value, said control means allows light emission of said light supplying means.

44. An exposure apparatus, comprising:

an optical system for directing light to a substrate to be exposed;

a cover for covering a predetermined portion of said optical system, wherein said cover has one of a door and a lid;

gas supplying means for supplying an inert gas to the inside of said cover;

detecting means for detecting a quantity of the inert gas inside said cover;

notifying means for notifying information related to the quantity of inert gas, on the basis of an output of said detecting means;

fixing means for fixing said door to said cover as said door or said lid is being closed; and a sensor for detecting closure/opening of said door or said lid.

45. An apparatus according to claim 44, wherein said detecting means detects one of a flow rate and a density of the inert gas.

46. An apparatus according to claim 44, further comprising an excimer laser for providing laser light.

47. An apparatus according to claim 44, wherein said notifying means includes display means for displaying the information.

48. An apparatus according to claim 44, wherein said optical system includes an illumination optical system for illuminating a mask, and the predetermined portion to be covered by said cover is a portion of or the whole of said illumination optical system.

49. An apparatus according to claim 48, wherein said optical system further includes a projection optical system for projecting a pattern of the mask, illuminated by said illumination optical system, onto the substrate to be exposed.

50. An apparatus according to claim 49, further comprising an excimer laser for providing laser light.

51. An apparatus according to claim 50, wherein said detecting means detects a density of the inert gas.

52. An apparatus according to claim 50, wherein said detecting means detects a flow rate of the inert gas.

53. An apparatus according to claim 50, wherein said cover has one of a door and a lid, and said apparatus further comprises fixing means for fixing said door to said cover as said door or said lid is being closed.

54. An apparatus according to claim 50, further comprising display means for displaying a state of light emission of said excimer laser.

55. An apparatus according to claim 50, wherein said apparatus comprises a plurality of covers for respectively covering a plurality of different portions of said illumination optical system, and said gas supplying means supplies inert gases to insides of said covers, respectively.

56. An apparatus according to claim 50, wherein said notifying means includes first display means for displaying the information.

57. An apparatus according to claim 56, wherein said cover has one of a door and a lid, and said apparatus further comprises a sensor for detecting closure/opening of said door or said lid.

58. An apparatus according to claim 57, wherein said supplying means includes an electromagnetically openable/closable valve for adjusting a flow of the inert gas.

59. An apparatus according to claim 58, wherein said notifying means further includes second display means for displaying closure/opening of said electromagnetically openable/closable valve.

60. An apparatus according to claim 59, further comprising control means wherein, when an output of said sensor represents a change of said door or said lid from a closed state to an open state, said control means closes said electromagnetically openable/closable valve, causes said second display means to display closure of said electromagnetically openable/closable valve, and causes said first display means to display whether a detected value, detected by said detecting means, exceeds a predetermined value.

61. An apparatus according to claim 60, wherein, when an output of said sensor represents a change of said door or said lid from the closed state to the open state, said control means produces a signal to stop light emission of said excimer laser.

62. An apparatus according to claim 57, wherein said electromagnetically openable/closable valve is controlled on the basis of an output of said sensor.

63. An apparatus according to claim 59, further comprising control means wherein, when an output of said sensor represents a change of said door or said lid from an open state to a closed state, said control means opens said electromagnetically openable/closable valve, causes said second display means to display opening of said electromagnetically openable/closable valve, and causes said first display means to display whether a detected value, detected by said detecting means, exceeds a predetermined value.

64. An apparatus according to claim 63, wherein, when an output of said sensor represents that the detected value, detected by said detecting means, does not exceed the predetermined value, said control means continues stoppage of light emission of said excimer laser, and wherein, when an output of said sensor represents that the detected value exceeds the predetermined value, said control means allows light emission of said excimer laser.

65. A device manufacturing method, comprising the steps of:

exposing a wafer to a device pattern by use of an exposure apparatus as recited in any one of the preceding claims; and developing the exposed wafer.

66. A device manufacturing method, comprising the steps of:

exposing a wafer with a device pattern by use of an exposure apparatus as recited in any one of claims 1, 2, 3, 4 through 25 and 22 through 29; and developing the exposed wafer.

* * * * *

UNITED STATES PATENT AND TRADEMARK OFFICE
CERTIFICATE OF CORRECTION

PATENT NO. : 6,295,121 B1
DATED : September 25, 2001
INVENTOR(S) : Gen Nakamura et al.

Page 1 of 1

It is certified that error appears in the above-identified patent and that said Letters Patent is hereby corrected as shown below:

Column 3,
Line 54, "system:" should read -- system; --.

Column 6,
Line 36, "caused" should read -- causes --.

Column 7,
Line 43, "recover" should read -- recovery --.

Column 10,
Line 16, "to" (first occurrence) should be deleted.

Column 12,
Line 4, "means" should read -- means, --.

Column 13,
Line 34, "means" should read -- means, --.

Column 14,
Line 10, "means" should read -- means, --.
Line 37, "claims 1, 2" should read -- 1 through 29; and --.
Line 38, "3, 4 through 25 and 22 through 29; and developing the" should read -- ¶ developing the --.

Signed and Sealed this

Twenty-sixth Day of March, 2002

*Attest:*

JAMES E. ROGAN
*Attesting Officer*   *Director of the United States Patent and Trademark Office*